United States Patent [19]

Archer et al.

[11] 4,031,526

[45] June 21, 1977

[54] MAGNETIC BUBBLE DOMAIN DETECTION DEVICE

[75] Inventors: John L. Archer, Orange; Leonard R. Tocci, Laguna Niguel; Jeffrey L. Williams, Corona, all of Calif.

[73] Assignee: Rockwell International Corporation, El Segundo, Calif.

[22] Filed: May 24, 1976

[21] Appl. No.: 689,435

Related U.S. Application Data

[63] Continuation of Ser. No. 290,607, Sept. 20, 1972, abandoned.

[52] U.S. Cl. .................... 340/174 TF; 340/174 EB
[51] Int. Cl.² ........................................ G11C 19/08
[58] Field of Search ............... 340/174 EB, 174 TF

[56] References Cited

UNITED STATES PATENTS

| 3,702,995 | 11/1972 | Bobeck et al. | 340/174 EB |
| 3,706,081 | 12/1972 | Bobeck et al. | 340/174 EB |
| 3,713,120 | 1/1973 | Bobeck et al. | 340/174 EB |

OTHER PUBLICATIONS

IEEE Transactions on Magnetics – vol. Mag. 9, No. 3, Sept. 1973, pp. 474–480.

*Primary Examiner*—James W. Moffitt
*Attorney, Agent, or Firm*—H. Fredrick Hamann; G. Donald Weber, Jr.

[57] ABSTRACT

A magnetic bubble domain device including a magnetoresistive element for detecting the presence of bubble domains which are stretched in a direction orthogonal to the propagation direction of the bubble domains.

6 Claims, 4 Drawing Figures

MAGNETIC BUBBLE DOMAIN DETECTION DEVICE

This is a continuation of application Ser. No. 290,607 filed Sept. 20, 1972 now abandoned.

BACKGROUND

Although magnetic "bubble" technology is relatively recent, the evolution of this technology has proceeded at a rapid pace. In this technology, various types of garnet compositions, prepared as magnetic epitaxial films (on a suitable non-magnetic substrate) and grown with growth or stress induced uniaxial anisotropy, are now available. Through known techniques, single wall cylindrical domains or "bubbles" (i.e. areas of one particular magnetic polarization) are established in a film which is otherwise saturated in the opposite magnetic polarization. Methods and techniques for generating such bubble domains in a magnetic film are known in the art.

This type of device (i.e. bubble domain detection device) has been proposed as a new electronic circuit device or component. At present, the major foreseeable utilization of magnetic bubble domain devices and materials is in the area of magnetic memory devices. As in any other memory device, the interest is in optimizing the number of bits per unit area and, thus, storage density. Clearly, the smaller the diameter of the individual bubble in the device, the more bubbles per unit area and, consequently, the greater the information storage density. However, as the bubble diameter decreases, bubble detection becomes increasingly difficult in view of the relatively strong magnetic effects of the demagnetizing fields in comparison to the fields generated by the bubble domains.

Several detector designs have been investigated to alleviate this detection problem. For example, detectors having the configuration of a large disk or a large rectangular shape have been tried. A relatively recent detector design has been suggested in a paper entitled "An Overview of Magnetic Bubble Domains-Material Device Interface", Proceedings of the 17th Annual Conference on Magnetism and Magnetic Materials, Chicago, 1971, Part 1, pages 45–55 by A. H. Bobeck et al. This detector is known as the "Chinese character detector" and, effectively, stretches the bubble domain. However, this detector causes the bubble domain to be stretched in a direction parallel to or along the propagation direction of the bubble. While this design, which is essentially three detectors in series, results in an output signal which is approximately 2.5 times larger than signals produced by single detector elements, other problems are encountered. For example, the Chinese character detector requires increased bubble velocity in order to achieve propagation past the detector which may reduce the data rate for the overall bubble device. In addition, the operating margins and, hence, the reliability at a given data rate is reduced for the overall bubble device. Consequently, it has become apparent that a new and improved detection technique and device is required which permits the magnetic device to utilize small diameter bubbles, provide high reliability and to effect a data handling capability capability and a data rate which is commensurate with the associated propagation pattern and the overall device.

SUMMARY OF THE INVENTION

A magnetic bubble detector utilizing at least two parallel multiple chevron or multiple-shaped magnetic elements disposed adjacent to a magnetoresistive element. A suitable propagation circuit is used to supply and receive bubble domains from the chevron detector. The chevron detector stretches the bubble domains perpendicular to the bubble propagation direction so that enlarged bubble domains are moved relative to the magnetoresistive element. A suitable sensing system is associated with the magnetoresistive device to determine any change in the resistance of said magnetoresistive device as a function of the passage of magnetic bubble domains adjacent to the magnetoresistive device.

DESCRIPTION OF PREFERRED EMBODIMENTS

Figure 1:
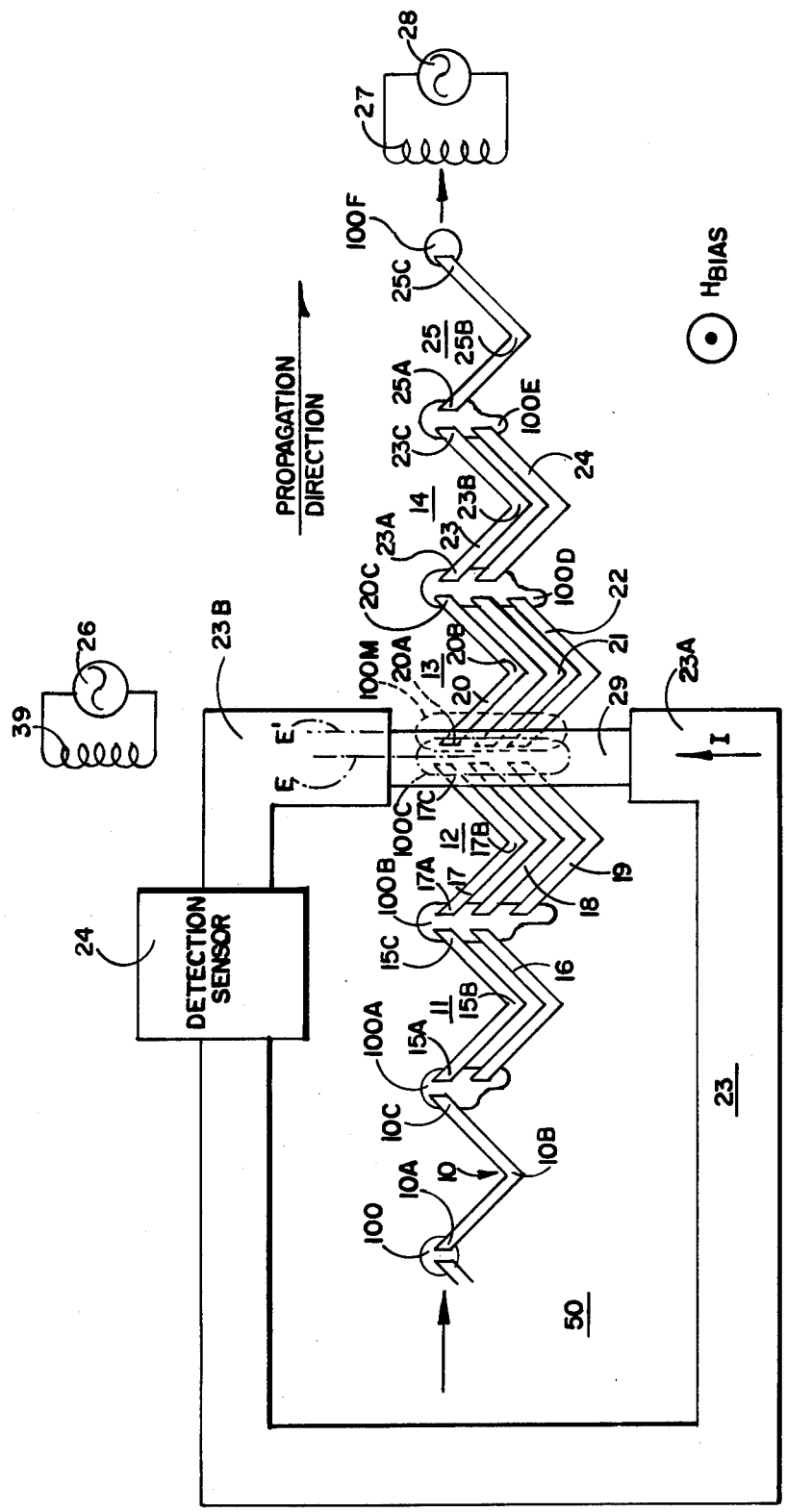
FIG. 1 is a diagramatic showing of one embodiment of the bubble domain detector of the instant invention.

Referring now to FIG. 1, there is shown a diagramatic representation of a chevron-bubble-domain-stretcher-detector. This showing is schematic and is not necessarily to scale.

The detector includes a detection sensor 24 which may be any suitable device such as, electronic circuity, a current sensing device or the like. The type of detection sensor is determined by the remainder of the circuit and is not necessarily a portion of the invention, per se. Detection sensor 24 is connected to a conductor strip 23 (schematically shown) including conductor ends 23A and 23B. Magnetoresistive element 29 is connected between conductor ends 23A and 23B. In a grossly oversimplified description, a constant current may be applied through conductor 23 and magnetoresistive element 29 by any suitable source (not shown). Detection sensor 24 detects (and perhaps displays) the voltage across the magnetoresistive element 29. This voltage will vary as a function of the resistance of magnetoresistive element 29. The resistance of element 23 is selectively varied by the passage of a magnetic bubble domain adjacent thereto.

Figure 2:
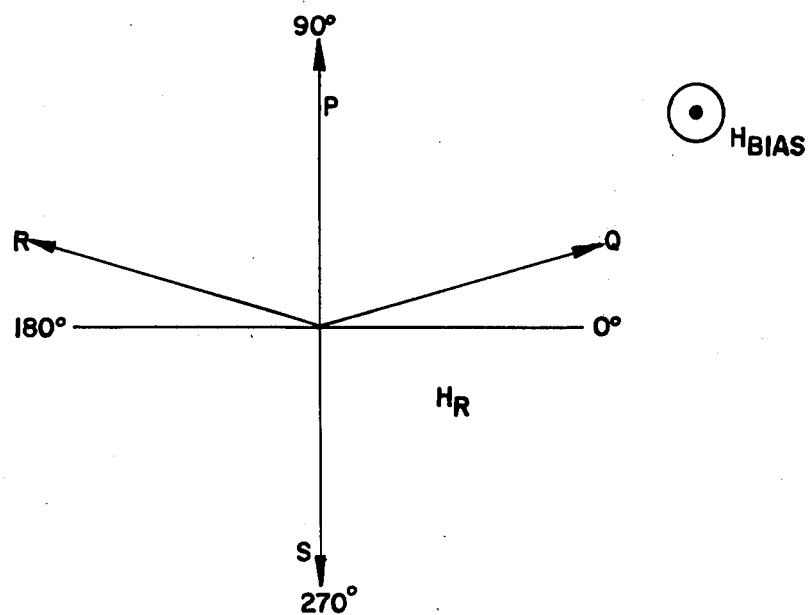
FIG. 2 is a diagramatic showing of a rotating magnetic field applied to the bubble domain device.

A pattern of chevrons, or similar elements, fabricated of soft magnetic material is provided on the magnetic material to establish a propagation path. The propagation path is located adjacent to (e.g. beneath) magnetoresistive element 29. The magnetic film material may be of any suitable composition known in the art in which bubble domains can be formed. Magnetic field $H_{BIAS}$ is a static magnetic field applied perpendicular to the thin magnetic bubble domain film 50. The bias field establishes and maintains stable bubble domains in the magnetic film. The propagation path elements may be formed of a suitable permalloy. The permalloy propagation path includes a V-shaped propagation element 10. Adjacent to one arm of the V-shaped element 10 is a further propagation device 11. The propagation structure 11 includes a plurality of chevron or V-shaped propagation elements 15 and 16. Immediately adjacent to structure 11 is an additional propagation structure 12 which comprises a plurality of V-shaped or chevron 17, 18 and 19. A portion of structure 12 is located adjacent to magnetoresistive element 29. More than three elements may be used at structure 12 in some applications if additional bubble domain stretching is required. However, three elements are shown for purposes of illustration. Another V-shaped or chevron type propagation structure 13 comprising elements 20, 21 and 22 is located adjacent to propagation structure 12. Again, a portion of structure 13 is located adjacent to magnetoresistive element 29. Specifically, the C-region ends (e.g. 17C) of structue 12 are adjacent to A-region ends (e.g. 20A) of structure 13. These adjacent regions are adjacent to magnetoresistive element 29. Propagation structure 14, including elements 23 and 24, is located adjacent to the ends of the chevron elements of propagation structure 13. Propagation structure 15 comprising element 25 is located adjacent to structure 14. Structures 10 and 14 may be considered to be interface structures. Other propagation structures (not shown) of any suitable shape or design (e.g. Y-bar, T-bar, chevron, and the like) may be located adjacent to the free ends of propagation devices 10 and 14, respectively. A detailed description of the additional propagation path is deemed unnecessary inasmuch as this is not a portion of the invention, per se, and is known in the art. Of course, the configuration of the structures in the propagation path shown are illustrative only and any suitable path configuration can be utilized in accordance with the particular application Coils 39 and 27 are connected to suitable sources 25 and 28. These coils are located approximately 90° apart relative to each other. In some embodiments, an additional pair of coils and sources (not shown) are also provided so that the coils are located in quadrature with respect to the magnetic bubble domain array. Coils 39 and 27, with the associated sources, are arranged to effectively provide a rotational magnetic field ($H_R$). That is, a magnetic field is generated which effectively rotates with respect to the magnetic domain device. The rotational field $H_R$ is suggested by the rotational vector shown in FIG. 2.

Figure 3:
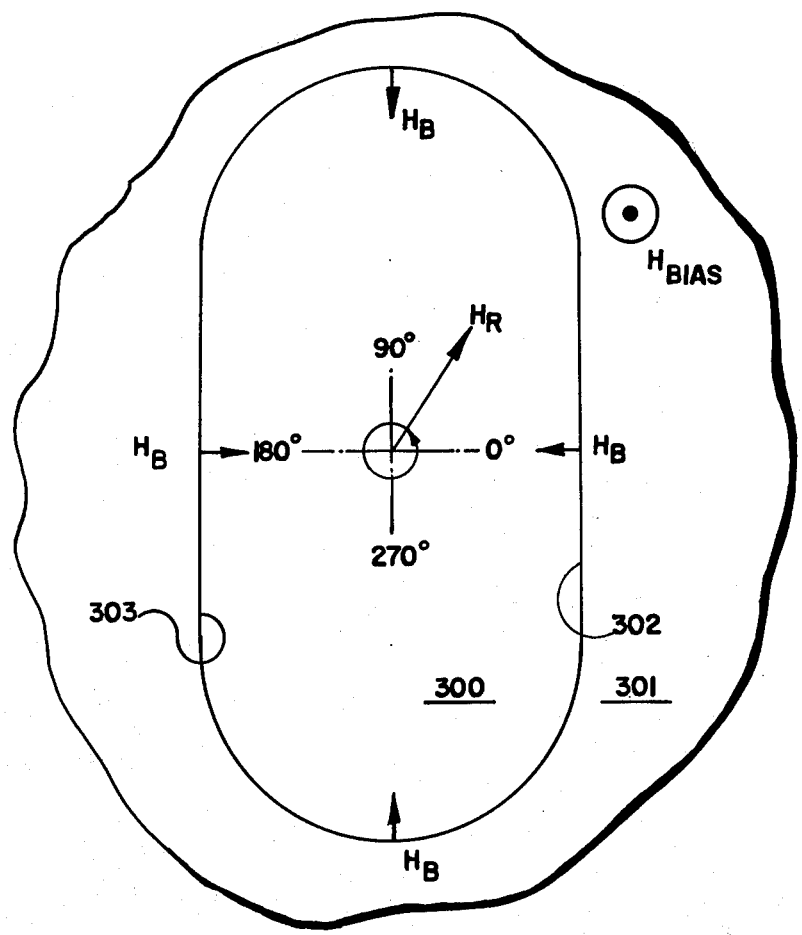
FIG. 3 is a simplified diagram of a bubble domain with the appropriate magnetic fields displayed thereon.

Referring to FIG. 3, there is shown a diagramatic representation of a stretched magnetic bubble domain 300 included in a thin magnetic film 301. This material is included in order to explain the effect of the magnetic fields at detector structure 12 and element 29. As is known in the art, the bubble domain 300 represents an area of magnetic polarization of one direction while the thin magnetic film 301 represents an area of magnetic polarization in the opposite direction. Consequently, radial components $H_B$ of the bubble domain magnetic field exist between magnetic bubble domain 300 and thin magnetic film 301.

While the exact operation of the magnetic effects is not completely established at this time, it is theorized that, for most purposes, the edge effects of fields $H_B$ at the arcuate end regions of bubble domain 300 can be ignored. That is, it is believed that these end effects tend to cancel each other and, thus, to have little or no effect on magnetoresistive element 29 in this detection system. However, the "side edge effect" of field $H_B$ as detected at sides 302 and 303 of stretched bubble domain device 300 have more significance in the operation of the detector device. That is, it is believed that the "side" effects at sides 302 and 303 tend to negate or cancel each other (relative to element 29) when the bubble domain is immediately under element 29. However, as the bubble domain passes element 29, the effects of the field at first one side and then the other side of the bubble domain are effective to cause changes in the resistance of the magnetoresistive element. Thus, the bubble is effectively detected as it passes each of the edges or sides of element 29. In essence, a dual spike pulse is generated by each bubble domain which passes element 29.

In operation of the structure shown in FIG. 1, propagation of magnetic bubble domains through the bubble domain material (e.g. thin magnetic film) occurs as a result of the rotational field $H_R$ (see FIG. 2) which selectively produces magnetic poles in the propagation elements and structures. For example, when field $H_R$ is in position R (e.g. between 90° and 180° in the diagram of FIG. 2) a magnetic pole is established at region 10A of propagation structure 10. Similarly, magnetic poles are produced, at this time, at region 15A of chevron-element 15, at the end region 17A of chevron-element 17 and so forth. Of course, magnetic poles are produced at the associated end region of chevrons 16, 18 and 19 as well. However, these chevron regions have not been given reference numerals in order to reduce complexity of the diagram.

As field $H_R$ rotates to the position S (e.g. at the 270° position), a new magnetic pole is formed at the apex 10B of propagation device 10. Similarly, magnetic poles are developed at the apex of the chevron-elements such as at position 15B, 17B and the like. Of course, the magnetic pole at region 10A (and so forth) is removed. Finally, as the rotational field $H_R$ rotates to position Q (between 0° and 90°), magnetic pole is produced at the right-hand ends of the propagation elements, e.g. at regions 10C, 15C, 19C and the like.

As the magnetic pole is moved from the A, through the B, and to the C regions, the magnetic bubble domain is moved therewith. That is, as a magnetic pole is produced at region A, a magnetic bubble domain is attracted thereto. When the magnetic pole moves to the B region, the magnetic bubble domain moves to that position as well. Ideally, this action would occur concurrently. However, in practice, the bubble domain generally lags the magnetic field $H_R$. As the rotational frequency of $H_R$ increases, the leg time also increases. Clearly, when the magnetic pole moves to the C region of any propagation element, the magnetic bubble domain is attracted to that position. Thus, a magnetic bubble domain, such as bubble domain 100, will move from region 10A through region 10B to region 10C. Bubble domain 100A will, essentially, maintain the substantially circular configuration at element region 10C while the rotational field $H_R$ remains substantially at the Q position. This bubble domain configuration is suggested by the dashed line associated with bubble domain 100A.

As soon as the rotational field $H_R$ reaches the R condition, a magnetic pole is produced at the A region of chevron-elements 15 and 16 of structure 11. Consequently, bubble domain 100A is attracted to the A regions of chevron-elements 15 and 16. Clearly, bubble domain 100A is elongated or stretched between chevron-elements 15 and 16. However, it should be noted that even though bubble domain 100A is stretched or elongated, the width thereof remains substantially consistent with the diametric dimension of bubble domain 100. That is, the bubble is not made significantly thinner due to the stretching thereof. Incidentally, it should be noted that while a circular configuration is suggested for bubble domain 100, in actuality, a bubble domain is substantially cylindrical in the magnetic film.

As noted supra, the propagation of bubble domains along propagation paths defined by the chevron-elements continues and the bubble domain moves from the A, through the B to the C regions of chevron-elements 15 and 16. Again, as the $H_R$ field continues to rotate, magnetic poles are developed at the A regions of propagation chevron-elements 17, 18 and 19. Thus, bubble domain 100B is further elongated and is stretched to encompass the three chevron-elements in propagation structure 12. The propagation of the bubble domain to the positions indicated by bubble domains 100C, 100D and 100E proceeds as described supra with a reverse or shrinking operation of the bubble domain. This propagation technique is known in the art. When field $H_R$ reaches the position P (see FIG. 2) bubble domain 100C (shown in dash-dot outline) is, essentially, located at the C regions of elements 17, 18 and 19 in structure 12 and the A regions of elements 20, 21 and 22 of structure 13. This condition results in bubble domain 100C being located directly under the magnetoresistive element 29 (e.g. at position E) wherein little or no effect is caused on element 29 by bubble 100C. However, when rotational field $H_R$ reaches position R (see FIG. 2) bubble domain 100C shifts to the magnetic poles generated at regions A of the chevron-elements of structure 13. Thus, the bubble domain assumes the position of bubble 100M (shown in the dashed outline). Therefore, the bubble has moved from position E to position E' relative to magnetoresistive element 29 as shown. Thus, bubble 100M has the trailing edge thereof adjacent to magnetoresistive device 29 while the leading edge thereof is spaced away from element 29. Consequently, for the reasons described supra, relative to FIG. 3, a pronounced effect is made on element 29 by bubble domain 100M. This effect is manifested in a significant change in the resistance of magnetoresistive element 29. The change in resistance of element 29 is detected, as noted supra, and indicates the detection of a bubble domain. Of course, when $H_R$ is at position R, the bubble is adjacent to the other side of element 29 and has a similar effect thereon. Consequently, the "dual-spike" pulse is produced as suggested supra.

Figure 4:
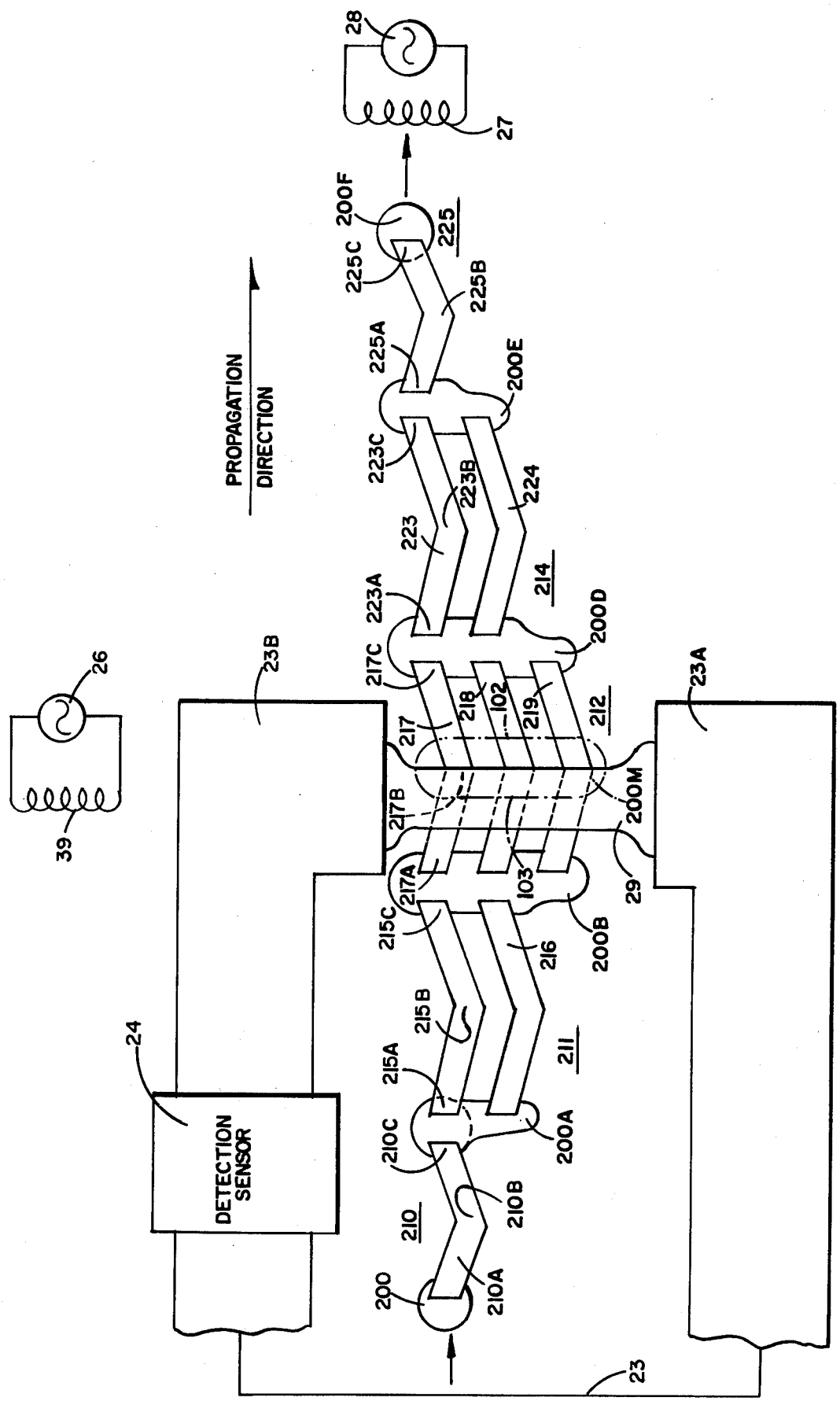
FIG. 4 is a diagramatic showing of another embodiment of the instant invention.

Referring now to FIG. 4, there is shown another embodiment of the instant invention. In FIG. 4, elements which are similar to those shown in FIG. 1 have retained similar reference numerals. Moreover, elements which have counterparts which are not fully similar to elements in FIG. 1, bear reference numerals in the 200 series but the relationship between the elements of FIGS. 1 and 4 is readily apparent.

Thus, the propagation path shown in FIG. 4 includes propagation structure 210 which is disposed adjacent to the chevron-shaped elements 215 and 216 which form propagation structure 211. Likewise, at the other end of the propagation path shown in FIG. 2, propagation structure 225 is adjacent to propagation structure 214 which includes chevron-elements 223 and 224. These elements (or devices) operate in the same manner as the counterpart devices or elements shown in FIG. 1 and described relative thereto.

The distinction between FIGS. 1 and 4 resides in the position of the magnetoresistive element 29 relative to the propagation path. In FIG. 1, propagation structures 12 and 13 (which include chevron elements 17, 18 and 19, and elements 20, 21 and 22, respectively) are located immediately adjacent one another with the ends of the chevron-elements arranged under element 29. However, in FIG. 4, propagation structure 12 comprises three chevron detector elements 217, 218 and 219 which have the apices thereof located substantially adjacent to magnetoresistive element 29.

When the bubble domain reaches the position of stretched bubble 200B, little or no effect is made upon magnetoresistive element 29. That is, bubble domain 200B is too far removed from element 29 to change the resistance thereof. However, when bubble domain 200B, which has been elongated to encompass the three chevron-elements 217, 218 and 219, is moved to the B region of the chevron-elements as a result of the rotation of field $H_R$, the magnetic field adjacent to the magnetoresistive element 29 is altered and causes a change in the resistance of element 29. When the resistance of element 29 changes, the voltage across the magnetoresistive element 29 changes and is detected by detection sensor 24 in any suitable and desired manner.

Consequently, it has been determined that a favorable position for detection of a bubble domain in the embodiment of FIG. 4 is represented by bubble domain 200M (shown in dashed outline). Bubble domain 200M is shown at the apex or B regions of chevron-elements 217, 218 and 219. The bubble is positioned in the B region because of the magnetic pole which was previously developed at the apex of the chevron-elements when the rotating field $H_R$ is in the S or 270° position. In the favorable condition, bubble domain 200M has the trailing edge adjacent the magnetoresistive element 29 while the leading edge has already propagated beyond the magnetoresistive element. Thus, the $H_B$ component related to side 103 of bubble domain 200M (which corresponds to side 303 of bubble domain 300) is very much effective with respect to element 29. However, the effect of field $H_B$ at side 102 of bubble domain 200M (similar to side 302 of bubble domain 300) has little or no effect on magnetoresistive element 29.

Thus, there has been shown and described a bubble domain detector which utilizes a magnetoresistive element. This magnetic bubble domain detector utilizes the principle of stretching the bubble domain to establish a larger flux area. In particular, this detector stretches the bubble domain in the direction orthogonal to the direction of propagation of bubble domains through the system. Thus, the detector operates in an improved fashion inasmuch as the increased area of magnetic flux provided by the stretched bubble domains and the additional flux provided by the propagation structures permits the utilization of larger detector elements. In addition, larger detector output signals are provided. Furthermore, by stretching the bubble domain orthogonal to the direction of propagation, greater data handling capability and greater rates of data handling capabilities are permitted inasmuch as the velocity of a bubble domain remains substantially unchanged, relative to the remainder of the system, as the domain propagates through the detector.

While the propagation path has been shown to utilize chevron-shaped propagation elements, any other suitably shaped elements such as Y-bar or T-bar elements are intended to be included within the scope of this invention. Moreover, while a parallel arrangement of up to three chevron elements has been shown, this number is illustrative only and is not meant to be limitative. Those skilled in the art will understand that the propagation path and the specific number of elements in the bubble domain stretcher are matters of design which may vary application to application.

Consequently, the chevron detector described above is to be interpreted broadly and any modifications thereof which fall within the purview of this invention are intended to be included therein. The scope of the invention is intended to be limited only by the claims appended hereto.

Consequently, what is claimed is:

1. A magnetic device comprising,
   a magnetic film capable of maintaining isolated domains therein wherein said domains have different magnetic polarization than said film,
   a plurality of magnetizable areas on said magnetic film for controlling the position of said isolated domains in said film,
   at least some of said plurality of magnetizable areas arranged adjacent to each other for expanding said isolated domains in a direction different from the direction of motion of said domains through said magnetic film, and
   detector means adjacent to said magnetizable areas for detecting the presence of an expanded isolated domain at said magnetizable areas,
   said detector means including a single magnetoresistive element the resistance of which varies as a function of the proximity of said expanded isolated domain,
   said magnetizable areas disposed on said magnetic film under said detector means.

2. The magnetic device recited in claim 1 including,
   first magnetic field producing means disposed adjacent to said magnetic film for permitting the establishment of said isolated domains in said magnetic film, and
   second magnetic field producing means disposed adjacent to said magnetic device for controlling the motion of said isolated domains through said magnetic film.

3. The magnetic device recited in claim 1 wherein said magnetizable areas are arranged in a prescribed pattern and selectively exhibit magnetic poles whereby said isolated domains are controllably attracted to said poles and moved relative to said preselected pattern of magnetizable areas.

4. The magnetic device recited in claim 1
   wherein said magnetizable areas include a substantially V-shaped portion and,
   said magnetizable are arranged in parallel relationship.

5. The magnetic device recited in claim 4 wherein said magnetoresistive element is disposed adjacent an end region of each of said magnetizable areas.

6. The magnetic device recited in claim 4 wherein said magnetoresistive element is disposed adjacent the apex region of each of said magnetizable areas.

* * * * *